(12) United States Patent
Gawase et al.

(10) Patent No.: US 8,936,729 B2
(45) Date of Patent: Jan. 20, 2015

(54) PLANARIZING METHOD

(75) Inventors: Akifumi Gawase, Yokohama (JP); Yukiteru Matsui, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 20 days.

(21) Appl. No.: 13/603,924

(22) Filed: Sep. 5, 2012

(65) Prior Publication Data

US 2013/0157464 A1    Jun. 20, 2013

(30) Foreign Application Priority Data

Dec. 20, 2011  (JP) ................................. 2011-278837

(51) Int. Cl.
*H01L 21/306*  (2006.01)
*B44C 1/22*  (2006.01)

(52) U.S. Cl.
USPC ................. 216/38; 216/90; 216/99; 216/109; 438/692; 257/E21.23

(58) Field of Classification Search
None
See application file for complete search history.

(56) References Cited

U.S. PATENT DOCUMENTS

| | | | | |
|---|---|---|---|---|
| 6,004,887 | A * | 12/1999 | Matsuno | 438/783 |
| 6,191,463 | B1 * | 2/2001 | Mitani et al. | 257/411 |
| 6,361,415 | B1 * | 3/2002 | Sethuraman et al. | 451/60 |
| 6,521,534 | B1 * | 2/2003 | Robinson et al. | 438/691 |
| 7,936,026 | B2 * | 5/2011 | Taketani | 257/411 |
| 8,552,425 | B2 * | 10/2013 | Ichijo et al. | 257/43 |
| 8,558,298 | B2 * | 10/2013 | Shinhara | 257/296 |
| 2004/0139764 | A1 | 7/2004 | Komiya et al. | |
| 2005/0072524 | A1 | 4/2005 | Mueller et al. | |
| 2005/0202670 | A1 * | 9/2005 | Shinmaru et al. | 438/626 |
| 2006/0070980 | A1 * | 4/2006 | Marumo et al. | 216/88 |
| 2008/0073693 | A1 * | 3/2008 | Kim et al. | 257/315 |
| 2008/0121529 | A1 * | 5/2008 | Tohma et al. | 205/640 |
| 2009/0206383 | A1 * | 8/2009 | Kim et al. | 257/316 |
| 2010/0224922 | A1 * | 9/2010 | Shinhara | 257/296 |
| 2012/0220195 | A1 * | 8/2012 | Gawase et al. | 451/7 |
| 2013/0102154 | A1 * | 4/2013 | Lee et al. | 438/692 |
| 2013/0119013 | A1 * | 5/2013 | Matsui et al. | 216/38 |
| 2013/0344665 | A1 * | 12/2013 | Shinhara | 438/239 |

FOREIGN PATENT DOCUMENTS

| | | |
|---|---|---|
| JP | 08-255773 | 10/1996 |
| JP | 2003-209076 A | 7/2003 |
| JP | 2003-530713 A | 10/2003 |
| JP | 2004-72099 | 3/2004 |
| JP | 2004-219391 A | 8/2004 |
| JP | 2008-81389 | 4/2008 |
| JP | 2008-121099 | 5/2008 |

OTHER PUBLICATIONS

First Office Action from the Japanese Patent Office relating to Patent Application No. 2011-278837; mailed Oct. 21, 2014 (Japanese and English-language translation—4 pgs.).

* cited by examiner

*Primary Examiner* — Allan Olsen
(74) *Attorney, Agent, or Firm* — Finnegan, Henderson, Farabow, Garrett & Dunner, LLP

(57) ABSTRACT

According to one embodiment, a planarizing method is proposed. In the planarizing method, a surface to be processed of an object to be processed including a silicon oxide film is planarized in a processing solution by bringing the surface to be processed into contact with or close proximity with the surface of a solid-state plate on which fluorine is adsorbed. The bonding energy between fluorine and the solid-state plate is lower than that between fluorine and silicon.

17 Claims, 5 Drawing Sheets

PLANARIZING METHOD

CROSS-REFERENCE TO RELATED APPLICATIONS

This application is based upon and claims the benefit of priority from Japanese Patent Application No. 2011-278837, filed Dec. 20, 2011, the entire contents of which are incorporated herein by reference.

FIELD

Embodiments described herein relate generally to a planarizing method.

BACKGROUND

Recently, CMP (Chemical Mechanical Polishing) is widely used in the manufacture of semiconductor devices in order to planarize an insulating film, metal film, or polysilicon film formed to fill trenches formed in a substrate. CMP is a method by which a polishing agent (slurry) containing abrasive grains and a liquid chemical is supplied onto polishing cloth, and the polishing cloth is brought into contact with an object to be processed, thereby planarizing a surface to be processed by combining a chemical action of the liquid chemical and a mechanical action of the abrasive grains. However, this method has the problem that polishing damage occurs on the surface to be processed because mechanical damage by the abrasive grains is unavoidable.

DETAILED DESCRIPTION

Figure 1:
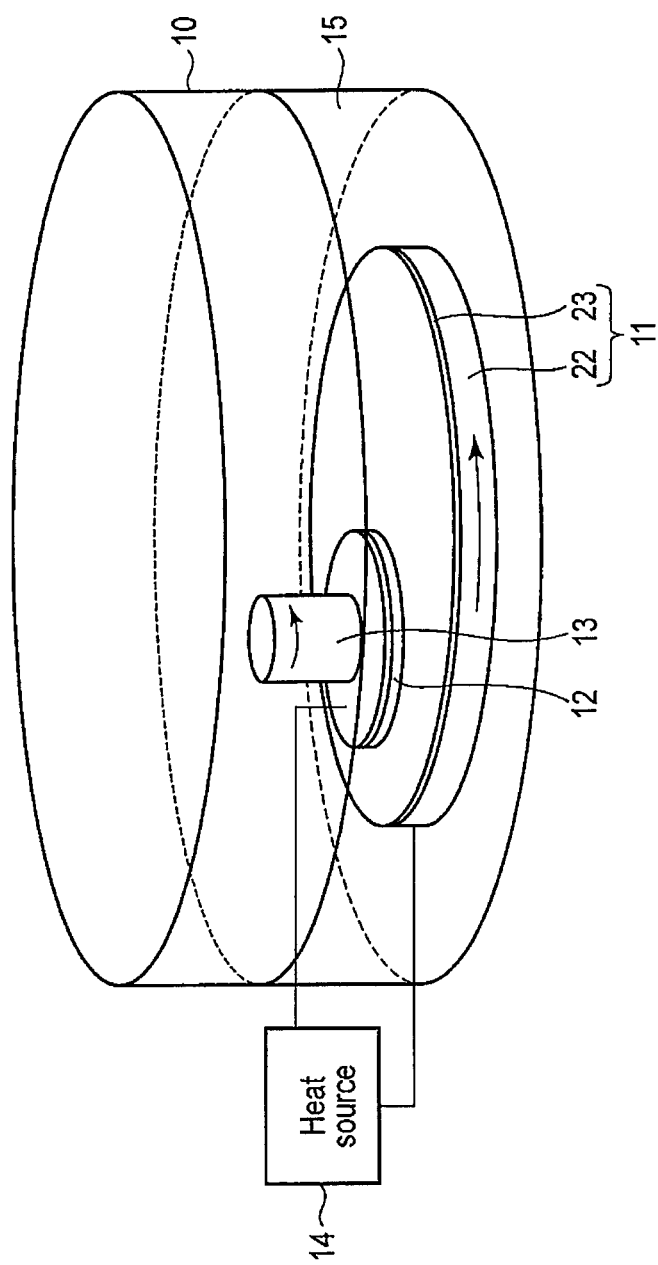
FIG. 1 is a perspective view showing an example of the arrangement of a planarizing apparatus for planarizing a silicon oxide film according to an embodiment.

In general, according to one embodiment, a planarizing method is provided. In the planarizing method, a surface to be processed of an object to be processed including a silicon oxide film is planarized in a processing solution by bringing the surface to be processed into contact with or close proximity with the surface of a solid-state plate on which fluorine is adsorbed. The bonding energy between fluorine and the solid-state plate is lower than that between fluorine and silicon.

This embodiment will be explained below with reference to the accompanying drawing. In the drawing, the same reference numerals denote the same parts. Also, a repetitive explanation will be made as needed.

Embodiment

The planarizing method according to this embodiment will be explained with reference to FIGS. 1, 2, 3, 4, and 5. This embodiment is an example in which a surface to be processed of an object 12 to be processed including a silicon oxide film 21 is brought into contact with the surface of a solid-state plate 11 on which fluorine (F) 23 is adsorbed in a processing solution 15 as an acidic solution, thereby chemically dissolving the surface to be processed of the silicon oxide film in contact with the solid-state plate 11, and planarizing the surface to be processed. This embodiment can suppress polishing damage to the surface to be processed because no mechanical polishing is necessary. Details of this embodiment will be explained below.

[Planarizing Apparatus]

First, a planarizing apparatus for planarizing a silicon oxide film according to this embodiment will be explained with reference to FIG. 1. FIG. 1 is a perspective view showing an example of the arrangement of the planarizing apparatus for planarizing a silicon oxide film according to this embodiment.

As shown in FIG. 1, the planarizing apparatus according to this embodiment includes a vessel 10, solid-state plate 11, holder 13, and heat source 14.

The vessel 10 is filled with a processing solution 15. The processing solution 15 is an acidic solution having a pH of 7 or less. Anions contained in the processing solution 15 are less easily adsorbed on the solid-state plate 11 than fluorine ions. An example of the processing solution 15 is dilute nitric acid or dilute hydrochloric acid.

The solid-state plate 11 is set in the vessel 10 so as to be dipped in the processing solution 15. The solid-state plate 11 includes an ion exchanger 22 that readily adsorbs fluorine ions, and fluorine 23 is adsorbed on the surface of the ion exchanger 22. The ion exchanger 22 and fluorine 23 bond to each other by an ionic bond. The bonding energy between them is lower than that between the fluorine 23 and silicon. As the ion exchanger 22, it is desirable to use an ion exchanger containing iron oxide (FeO) or cerium (Ce). This makes it possible to stably adsorb (bond) the fluorine 23 and ion exchanger 22 even in an acidic solution.

The holder 13 holds the object 12 to be processed. The holder 13 can oppose the surface to be processed of the object 12 to be processed to the surface of the solid-state plate 11, and can bring them into contact with each other or separate them from each other. The amount of processing solution in the vessel 10 is adjusted so that the contact portion between the surface to be processed of the object 12 to be processed and the surface of the solid-state plate 11 is dipped in the processing solution 15. As will be described later, the surface to be processed (the silicon oxide film 21) of the object 12 to be processed can be planarized by bringing the surface to be processed of the object 12 to be processed into contact with or close proximity with the surface (the fluorine 23) of the solid-state plate 11 in the processing solution (acidic solution) 15.

The heat source 14 is connected to the solid-state plate 11 and object 12 to be processed, and raises the temperature of the contact portion between them. This makes it possible to accelerate the reaction (to be described later) between the solid-state plate 11 and object 12 to be processed, and increase the processing speed of the object 12 to be processed. The reaction between the solid-state plate 11 and object 12 to be processed can also be accelerated by raising the temperature of the processing solution 15 by the heat source 14.

Both the solid-state plate 11 and holder 13 are rotatable. By bringing them into contact with each other while rotating them, it is possible to generate frictional heat and raise the temperature of the contact portion between them. That is, it is possible to raise the temperature of the contact portion and accelerate the reaction between the solid-state plate 11 and object 12 to be processed without using the heat source 14. Note that frictional heat can also be generated by sliding the solid-state plate 11 and holder 13 against each other, instead of rotating them.

In this example, the solid-state plate 11 is fixed in the vessel 10, and the object 12 to be processed held by the holder 13 is brought into contact with the solid-state plate 11. However, the present embodiment is not limited to this. That is, it is also possible to fix the object 12 to be processed in the vessel 10, and bring the solid-state plate 11 held by the holder 13 into contact with the object 12 to be processed.

[Planarizing Method and Principle]

Next, the silicon oxide film planarizing method and principle according to this embodiment will be explained with reference to FIGS. 2, 3, 4, and 5. FIGS. 2, 3, 4, and 5 are sectional views showing silicon oxide film planarizing steps and the principle according to this embodiment.

Note that in this example, the object 12 to be processed includes a substrate 20 and a silicon oxide film 21 formed on the substrate 20, and the surface of the silicon oxide film 21 is the surface to be processed. The substrate 20 is, e.g., a semiconductor substrate, a glass substrate, or an insulating film formed on a semiconductor substrate. The solid-state plate 11 includes the ion exchanger 22 containing cerium, and the fluorine 23 is adsorbed on the surface of the ion exchanger 22. The holder 13 and heat source 14 shown in FIG. 1 are not illustrated.

Figure 2:
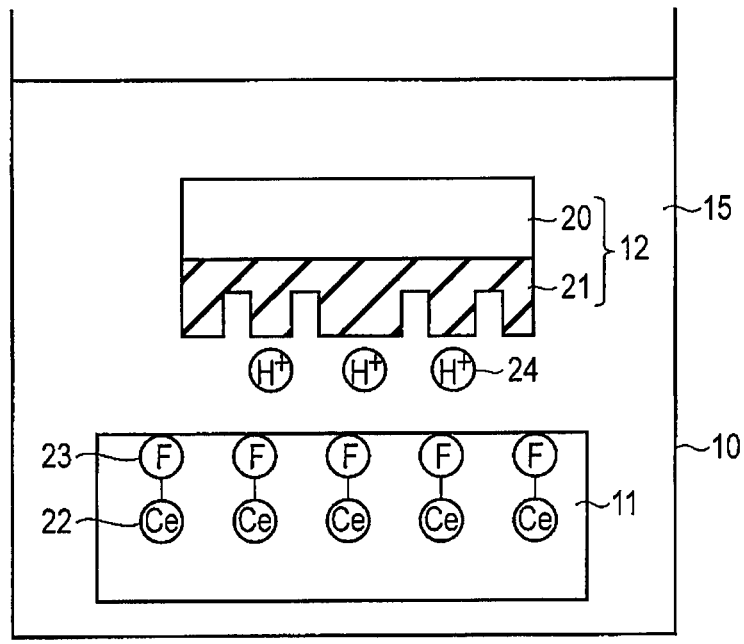
FIGS. 2, 3, 4, and 5 are sectional views showing silicon oxide film planarizing steps and the principle according to the embodiment.

First, as shown in FIG. 2, the object 12 to be processed including the silicon oxide film 21 is held such that the surface to be processed of the object 12 to be processed opposes the surface of the solid-state plate 11 in the processing solution 15. The surface to be processed of the silicon oxide film 21 has a three-dimensional (uneven) shape. The fluorine 23 is adsorbed on the surface of the solid-state plate 11. More specifically, the fluorine 23 bonds to cerium in the ion exchanger 22 by an ionic bond. The fluorine 23 is adsorbed on the surface of the solid-state plate 11 by dipping the ion exchanger 22 in, e.g., a hydrofluoric acid solution beforehand.

The processing solution 15 is an acidic solution, and contains hydrogen (H) ions 24. The bonding energy between anions contained in the processing solution 15 and the ion exchanger 22 is lower than that between the fluorine 23 and ion exchanger 22. Therefore, the fluorine 23 of the solid-state plate 11 is not dissociated alone in the processing solution 15. In other words, when the solid-state plate 11 and object 12 to be processed are sufficiently separated in the processing solution 15, the ionic bond between cerium and the fluorine 23 stably exists on the surface of the solid-state plate 11. An example of the processing solution 15 is dilute nitric acid or dilute hydrochloric acid.

Figure 3:
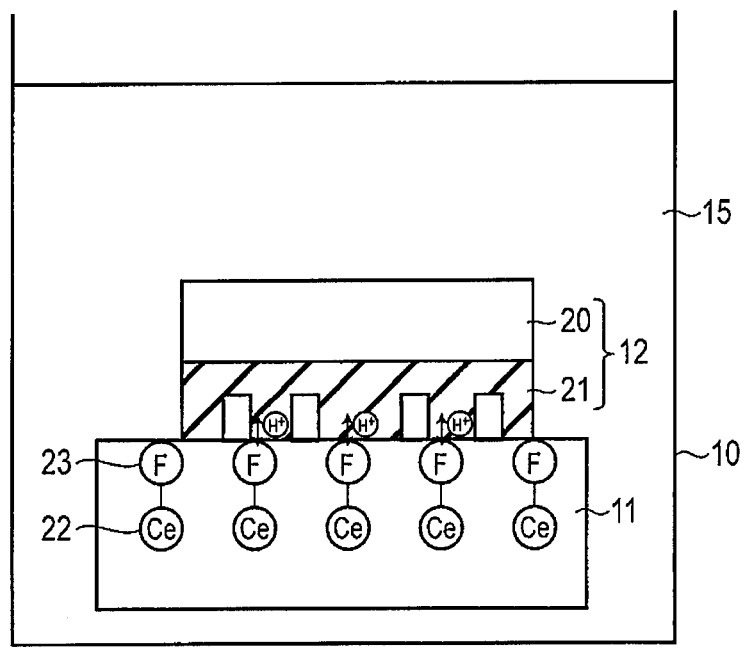

Then, as shown in FIG. 3, the object 12 to be processed is moved in the processing solution 15, thereby bringing the surface to be processed of the object 12 to be processed into contact with or close proximity with the surface of the solid-state plate 11. In this state, at least the contact portion or close proximity portion between the surface to be processed of the object 12 to be processed and the surface of the solid-state plate 11 is dipped in the processing solution 15. Consequently, the fluorine 23 on the surface of the solid-state plate 11 is attracted to silicon on the surface to be processed and dissociated as fluorine ions in the processing solution 15, and also reacts with silicon on the surface to be processed.

The dissociation of the fluorine 23 occurs because the fluorine 23 and ion exchanger 22 bond to each other in the solid-state plate 11 by a bond such as an ionic bond that has low bonding energy and readily causes dissociation in a liquid. More specifically, the dissociation of the fluorine 23 occurs because the bonding energy between the fluorine 23 and ion exchanger 22 is lower than that between the fluorine 23 and silicon on the surface to be processed. That is, the fluorine 23 is stabler when bonding to silicon than when bonding to the ion exchanger (cerium) 22 in the processing solution 15.

Note that the solid-state plate 11 may also contain iron oxide or the like in addition to cerium as the ion exchanger 22. Note also that the solid-state plate 11 is not limited to the ion exchanger 22, and need only be a material that bonds to the fluorine 23 by bonding energy lower than that between the fluorine 23 and silicon, and is readily dissociated in a liquid.

Figure 4:
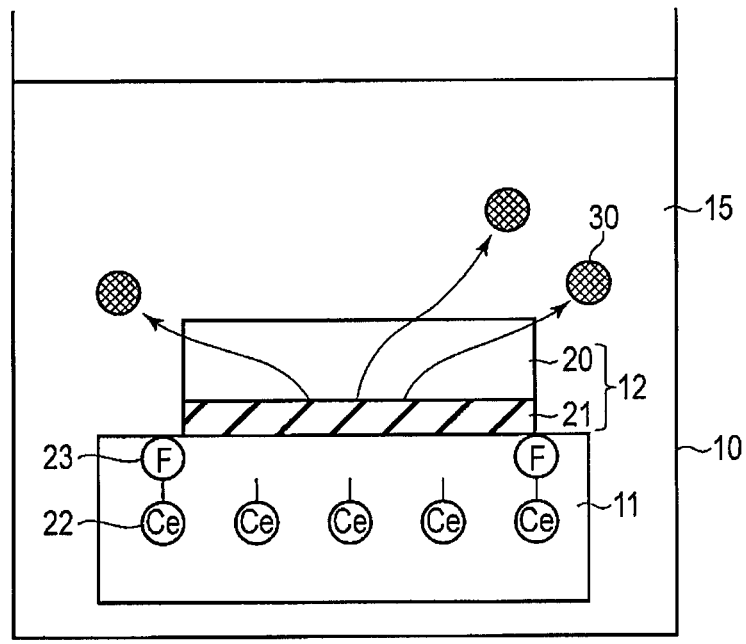

The reaction between the fluorine 23 and silicon on the surface to be processed preferentially progresses on projections of the surface to be processed of the silicon oxide film 21 in contact with or close proximity with the solid-state plate 11. As shown in FIG. 4, therefore, the projections of the surface to be processed are processed and planarized. More specifically, silicon dioxide ($SiO_2$) on the surface to be processed, fluorine ions ($F^-(HF_2^-)$) dissociated from the surface of the solid-state plate 11, and hydrogen ions ($H^+(H_3O^+)$) 24 in the processing solution 15 cause the following reaction.

$$SiO_2 + 6F^- + 6H^+ \rightarrow SiF_6^{2-} + 2H^+ + 2H_2O \quad (1)$$

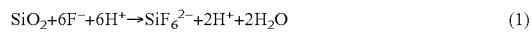

That is, the dissociated fluorine ions and silicon bond to each other and dissolve as hexafluorosilicic acid ions ($SiF_6^{2-}$) 30 in the processing solution 15 as an acidic solution.

Note that "close proximity" herein mentioned means that the surface to be processed of the object 12 to be processed and the surface of the solid-state plate 11 are brought into proximity to such an extent as to cause the dissociation of the fluorine 23.

The reaction of formula (1) continuously progresses at a sufficient rate. Therefore, the operating speed of the object 12 to be processed (the force of abutting the object 12 to be processed against the solid-state plate 11) is not particularly limited. That is, the object 12 to be processed is operated at an arbitrary speed and brought into contact with or close proximity with the solid-state plate 11.

Note that depending on the type of the ion exchanger 22 or processing solution 15, the reaction rate is low or the reaction does not progress because no activation energy required to dissociate the fluorine 23 can be obtained, if the object 12 to be processed and solid-state plate 11 are simply brought into contact with or close proximity with each other. In this case, the reaction can efficiently be advanced by raising the temperature of the contact portion between the solid-state plate 11 and object 12 to be processed.

For example, the temperatures of the solid-state plate 11 and object 12 to be processed can be raised by connecting the heat source 14 to them. It is also possible to accelerate the reaction between the solid-state plate 11 and object 12 to be processed by raising the temperature of the processing solution 15 by the heat source 14.

The temperature can also be raised by generating frictional heat by bringing the solid-state plate 11 and holder 13 into contact with each other while rotating them. Note that it is also possible to raise the temperature by generating frictional heat by sliding the solid-state plate 11 and holder 13 against each other, instead of rotating them.

Figure 5:
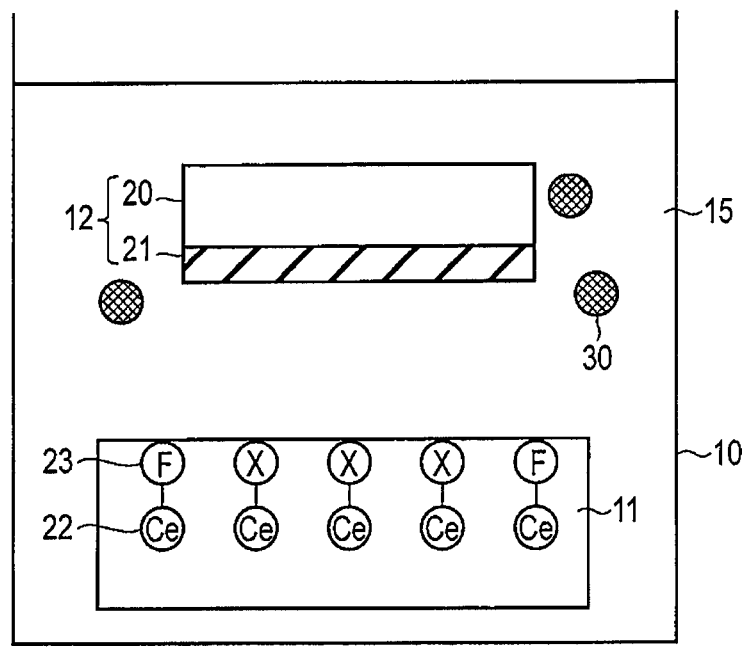

When the planarization of the surface to be processed is complete after that, the object 12 to be processed is separated from the solid-state plate 11 as shown in FIG. 5. In this state, the fluorine 23 is dissociated on the surface of the solid-state plate 11 brought into contact with the object 12 to be processed. Consequently, impurities X such as anions contained in the processing solution 15 or the hexafluorosilicic acid ions 30 generated by the reaction are adsorbed on the surface of the solid-state plate 11.

Accordingly, the solid-state plate 11 is dipped in a hydrofluoric acid solution before processing the next object to be processed. As a consequence, fluorine and cerium can be bonded (adsorbed) by an ionic bond on the surface of the solid-state plate 11 again.

Note that the silicon oxide film explained in this embodiment is not limited to a silicon dioxide ($SiO_2$) film, and may also be a silicon oxide film formed by CVD using silane or TEOS (tetraethylorthosilicate) as a material, or a silicon oxide film formed by a PSZ (polysilazane) coating method. It is also possible to use a silicon oxide film containing another element such as boron or phosphorus.

Effects

In the above-mentioned embodiment, the surface to be processed of the object 12 to be processed (the silicon oxide film 21) is brought into contact with the surface of the solid-state plate 11 on which the fluorine 23 is adsorbed, in the processing solution 15 as an acidic solution. Consequently, the surface to be processed of the silicon oxide film 21 in contact with the solid-state plate 11 is chemically dissolved and planarized. That is, the silicon oxide film 21 can be planarized by a chemical reaction alone without any mechanical polishing. This makes it possible to suppress polishing damage to the surface to be processed of the silicon oxide film 21 caused by mechanical polishing.

To process a silicon oxide film, it is necessary to cause a reaction by using an acidic solution and fluorine. This reaction can be caused by dipping the silicon oxide film in a hydrofluoric acid solution. However, if the silicon oxide film is simply dipped in the hydrofluoric acid solution, the silicon oxide film is isotropically processed, so the surface to be processed of the silicon oxide film cannot be planarized.

By contrast, in this embodiment, the silicon oxide film 21 is dipped in an acidic solution (the processing solution 15) that causes no reaction when the silicon oxide film is simply dipped, and the surface of the solid-state plate 11 containing the fluorine 23 is brought into contact with or close proximity with the surface to be processed of the silicon oxide film 21. This makes it possible to cause a reaction on only the surface to be processed of the silicon oxide film 21 in contact with or close proximity with the surface of the solid-state plate 11, and planarize the surface to be processed.

APPLICATION EXAMPLE

An application example of the planarizing method according to this embodiment will be explained below with reference to FIGS. 6, 7, 8, and 9. The planarizing method according to this embodiment is applicable to a semiconductor device STI (Shallow Trench Isolation) formation process.

FIGS. 6, 7, 8, and 9 are sectional views showing semiconductor device STI formation steps according to this embodiment.

Figure 6:
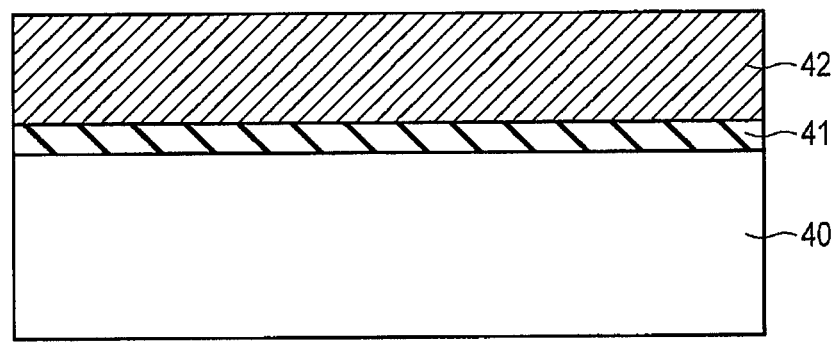
FIGS. 6, 7, 8, and 9 are sectional views showing semiconductor device STI structure manufacturing steps according to the embodiment.

First, as shown in FIG. 6, a tunnel insulating film 41 including a silicon oxide film or silicon nitride film is formed on a semiconductor substrate 40 by, e.g., CVD (Chemical Vapor Deposition). A charge storage film 42 containing polysilicon or amorphous silicon is formed on the tunnel insulating film 41 by, e.g., CVD.

Figure 7:
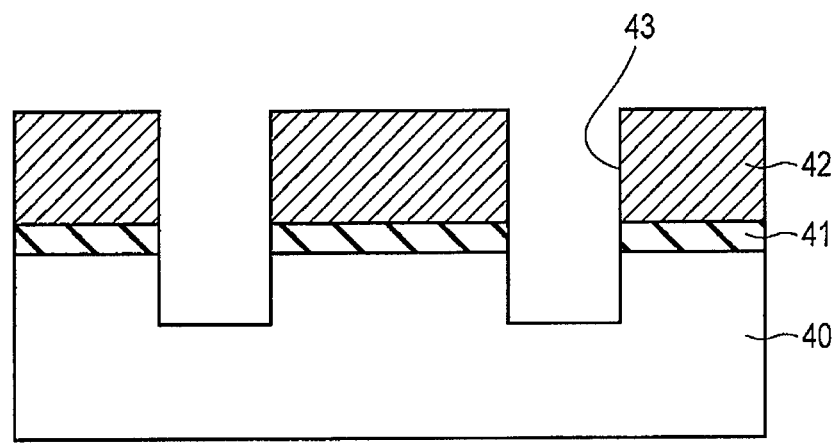

Then, as shown in FIG. 7, trenches 43 are formed in the charge storage film 42, tunnel insulating film 41, and semiconductor substrate 40 by lithography and RIE (Reactive Ion Etching). The trenches 43 are formed to extend through the charge storage film 42 and tunnel insulating film 41, and partially remove the semiconductor substrate 40.

Figure 8:
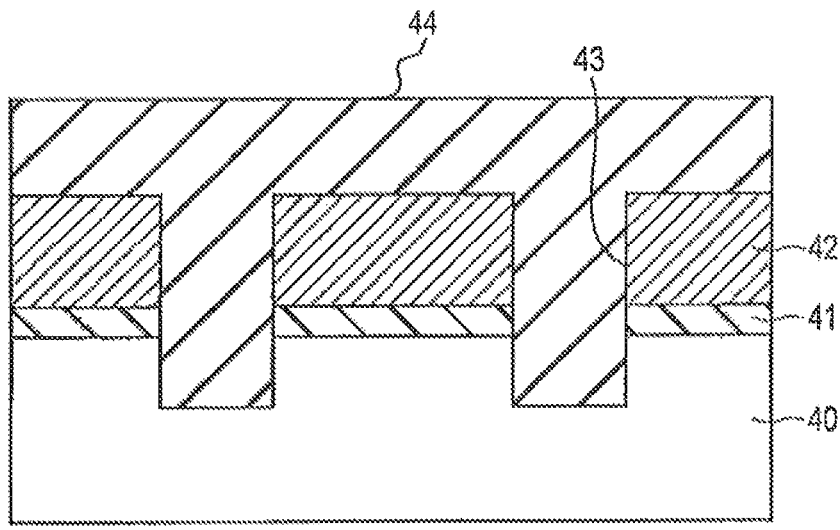

Subsequently, as shown in FIG. 8, an element isolation insulating film 44 including a silicon oxide film is formed on the entire surface by, e.g., CVD. In this step, the element isolation insulating film 44 is buried in the trenches 43 and formed on the charge storage film 42 outside the trenches 43.

Figure 9:
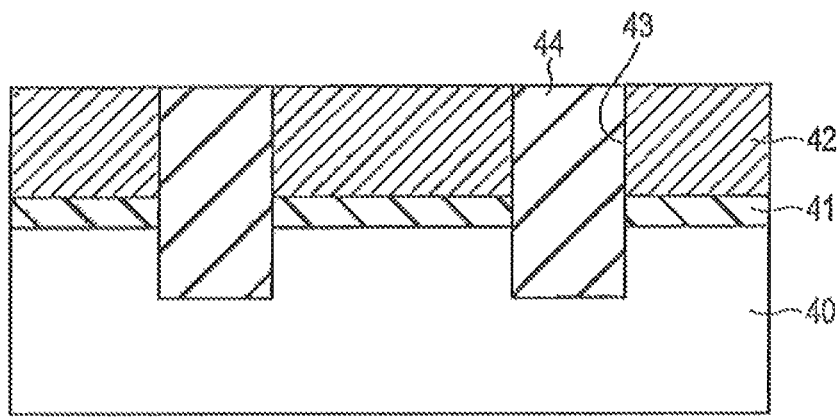

After that, as shown in FIG. 9, the element isolation insulating film 44 formed on the charge storage film 42 outside the trenches 43 is removed. In this step, the silicon oxide film planarizing method according to the above-mentioned embodiment is used. More specifically, the surface of the element isolation insulating film 44 is brought into contact with the surface of the solid-state plate 11 on which the fluorine 23 is adsorbed, in the processing solution 15. That is, the above-described planarizing method is performed on the surface of the element isolation insulating film 44 including the silicon oxide film, as a surface to be processed. This causes a reaction between the element isolation insulating film 44, processing solution 15, and fluorine 23. As a result, the element isolation insulating film 44 can be removed while planarizing the surface of the element isolation insulating film 44.

Note that this application example has been explained by taking a floating gate type STI structure as an example. However, the present embodiment is similarly applicable to a MONOS type structure. That is, the charge storage film 42 may also be an insulating film such as a silicon nitride film.

Thus, the STI structure of the application example is formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for chemically planarizing a silicon oxide containing surface of an object to be processed, the method comprising:

immersing the silicon oxide containing surface and an ion exchanger on which fluorine is absorbed into a processing fluid, wherein bonding energy between fluorine and the ion exchanger, bonding energy between fluorine and silicon, and bonding energy between anions contained in the processing solution and the ion exchanger, are such that a planarizing chemical reaction occurs without mechanical polishing when the silicon oxide containing surface is placed in contact with or close proximity to the ion exchanger; and placing the silicon oxide containing surface in contact with or close proximity to the ion exchanger, thereby initiating the planarizing reaction between the fluorine on the surface of the ion exchanger and the silicon oxide containing surface.

2. The method of claim 1, wherein the ion exchanger contains one of iron oxide and cerium.

3. The method of claim 1, wherein the processing solution is an acidic solution.

4. The method of claim 3, wherein the bonding energy between anions contained in the processing solution and the ion exchanger is lower than that between fluorine and the ion exchanger.

5. The method of claim 4, wherein the processing solution is one of dilute nitric acid and dilute hydrochloric acid.

6. The method of claim 1, wherein temperatures of the silicon oxide containing surface and the surface of the ion exchanger are raised when the silicon oxide containing surface is placed in contact with or close proximity to the ion exchanger.

7. The method of claim 6, wherein the temperatures of the silicon oxide containing surface and the surface of the ion exchanger are raised by connecting a heat source to the object to be processed and the ion exchanger.

8. The method of claim 6, wherein the temperatures of the silicon oxide containing surface and the surface of the ion exchanger are raised by placing the silicon oxide containing surface in contact with or close proximity to the ion exchanger while rotating the object to be processed and the ion exchanger.

9. The method of claim 6, wherein the temperatures of the silicon oxide containing surface and the surface of the ion exchanger are raised by placing the silicon oxide containing surface in contact with or close proximity to the ion exchanger while sliding the object to be processed and the ion exchanger.

10. The method of claim 1, wherein before planarizing the silicon oxide containing surface, fluorine is absorbed on the surface of the ion exchanger by dipping the ion exchanger in a hydrofluoric acid solution.

11. The method of claim 1, wherein the silicon oxide containing surface contains one of silicon dioxide, silicon oxide formed by CVD using one of silane and TEOS as a material, silicon oxide formed by a PSZ coating method, and silicon oxide containing boron and phosphorus.

12. The method of claim 1, further comprising, before planarizing the silicon oxide containing surface:
    forming a tunnel insulating film on a semiconductor substrate;
    forming a charge storage film on the tunnel insulating film;
    forming a trench in the charge storage film, the tunnel insulating film, and the semiconductor substrate; and
    burying the object to be processed in the trench, and forming the object to be processed on the charge storage film outside the trench.

13. The method of claim 12, wherein the object to be processed formed on the charge storage film outside the trench is planarized until the charge storage film is exposed.

14. The method of claim 13, wherein the charge storage film contains one of polysilicon and amorphous silicon.

15. The method of claim 13, wherein the charge storage film includes a silicon nitride film.

16. The method of claim 1, wherein anions contained in the processing solution are less easily absorbed on the ion exchanger than fluorine ions, and after the planarizing, the anions are absorbed on the surface of the ion exchanger.

17. The method of claim 1, wherein the bonding energy between fluorine and the ion exchanger is lower than that between fluorine and silicon.

* * * * *